United States Patent [19]

Kean

[11] Patent Number: 5,491,353
[45] Date of Patent: Feb. 13, 1996

[54] CONFIGURABLE CELLULAR ARRAY

[75] Inventor: Thomas A. Kean, Edinburgh, Scotland

[73] Assignee: Xilinx, Inc., San Jose, Calif.

[21] Appl. No.: 416,434

[22] Filed: Mar. 31, 1995

Related U.S. Application Data

[60] Continuation of Ser. No. 116,395, Sep. 3, 1993, abandoned, which is a division of Ser. No. 761,835, Sep. 13, 1991, Pat. No. 5,243,238.

[30] Foreign Application Priority Data

Mar. 17, 1989 [GB] United Kingdom .................. 8906145

[51] Int. Cl.$^6$ ...................... H01L 27/04; H01L 23/50
[52] U.S. Cl. .................. 257/208; 257/211; 257/204
[58] Field of Search .......................... 257/211, 204, 257/206, 208, 210

[56] References Cited

U.S. PATENT DOCUMENTS 4,766,476 8/1988 Schallenberger et al. ............ 257/208
4,893,170 1/1990 Tokuda et al. ...................... 257/204
4,990,992 2/1991 Uchida ............................... 257/211

Primary Examiner—Donald L. Monin, Jr.
Attorney, Agent, or Firm—Greg T. Sueoka; Jeanette S. Harms

[57] ABSTRACT

A configurable cellular array is provided having a 2-dimensional array of cells in which each cell in the array has at least one input and output connection at least one bit wide to its neighbours. Each cell also has a programmable routing circuit to permit intercellular connections to be made. In one arrangement each cell contains a programmable function unit which includes a plurality of multiplexers. In a preferred arrangement the function unit and routing unit are programmable using associated Random Access Memory (RAM) areas within the cell. Each cell may be coupled to at least one global or array-crossing-signals so that all cells can be signalled simultaneously. The 2-dimensional array is rectangular and the intercell connections are orthogonal and are one bit wide.

9 Claims, 16 Drawing Sheets

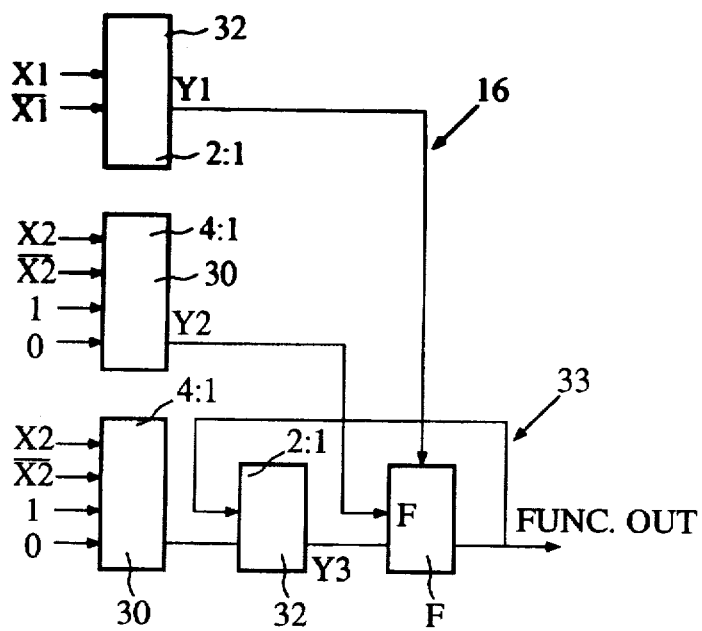

FIG. 4

| Number | Function | Y1 | Y2 | Y3 |
|---|---|---|---|---|
| 0 | Zero | x1 | 0 | 0 |
| 1 | One | x1 | 1 | 1 |
| 2 | X1 | x1 | 1 | 0 |
| 3 | $\overline{X1}$ | x1 | 0 | 1 |
| 4 | X2 | x1 | x2 | x2 |
| 5 | $\overline{X2}$ | x1 | $\overline{x2}$ | $\overline{x2}$ |
| 6 | X1·X2 | x1 | x2 | 0 |
| 7 | X1·$\overline{X2}$ | x1 | $\overline{x2}$ | 0 |
| 8 | $\overline{X1}$·X2 | x1 | 0 | x2 |
| 9 | $\overline{X1}$·$\overline{X2}$ | x1 | 0 | $\overline{x2}$ |
| 10 | X1 + X2 | x1 | 1 | x2 |
| 11 | X1 + $\overline{X2}$ | x1 | 1 | $\overline{x2}$ |
| 12 | $\overline{X1}$ + X2 | x1 | x2 | 1 |
| 13 | $\overline{X1}$ + $\overline{X2}$ | x1 | $\overline{x2}$ | 1 |
| 14 | X1 ⊕ X2 | x1 | $\overline{x2}$ | x2 |
| 15 | $\overline{X1 \oplus X2}$ | x1 | x2 | $\overline{x2}$ |
| 16 | D Latch | x1 = Clk | x2 = D | Func. Out |
| 17 | $\overline{D}$ Latch | x1 = Clk | $\overline{x2}$ = D | Func. Out |
| 18 | D $\overline{Clk}$ Latch | $\overline{x1}$ = Clk | x2 = D | Func. Out |
| 19 | $\overline{D}$ $\overline{Clk}$ Latch | $\overline{x1}$ = Clk | $\overline{x2}$ = D | Func. Out |

FIG. 5

| Number | Function | Y1 | Y2 | Y3 |
|---|---|---|---|---|
| 1 | X1 · X2 | x1 | x2 | 0 |
| 2 | $\overline{X1}$ · X2 | $\overline{x1}$ | x2 | 0 |
| 3 | X1 + X2 | $\overline{x1}$ | x2 | 1 |
| 4 | $\overline{X1}$ + X2 | $\overline{x1}$ | x2 | 1 |
| 5 | X1 ⊕ X2 | $\overline{x1}$ | x2 | $\overline{x2}$ |
| 6 | D Latch | x1 = Clk | x2 = D | Func. Out |
| 7 | D $\overline{Clk}$ Latch | $\overline{x1}$ = Clk | x2 = D | Func. Out |

| Number | Function | Y1 | Y2 | Y3 |
|---|---|---|---|---|
| 1 | X1 · X2 | x1 | x2 | 0 |
| 2 | $\overline{X1}$ · X2 | $\overline{x1}$ | x2 | 0 |
| 3 | X1 + X2 | x1 | x2 | 1 |
| 4 | $\overline{X1}$ + X2 | $\overline{x1}$ | x2 | 1 |
| 5 | X1 ⊕ X2 | $\overline{x1}$ | x2 | N,S,E,W |
| 6 | D Latch | x1 = Clk | x2 = D | Func. Out |
| 7 | D $\overline{Clk}$ Latch | $\overline{x1}$ = Clk | x2 = D | Func. Out |
| 8 | RS Latch | Func. Out | x2 | x1 |
| 9 | 2:1 Mux. | x1 | x2 | N,S,E,W |

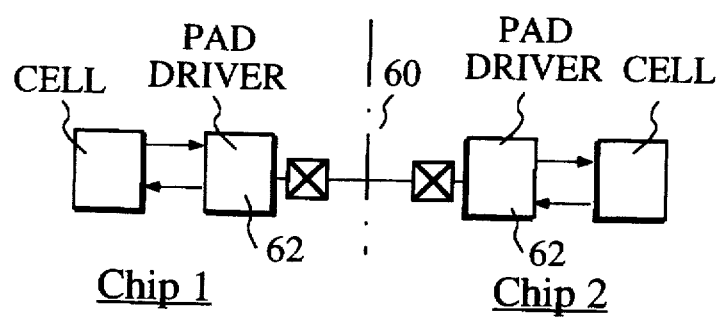
FIG. 12
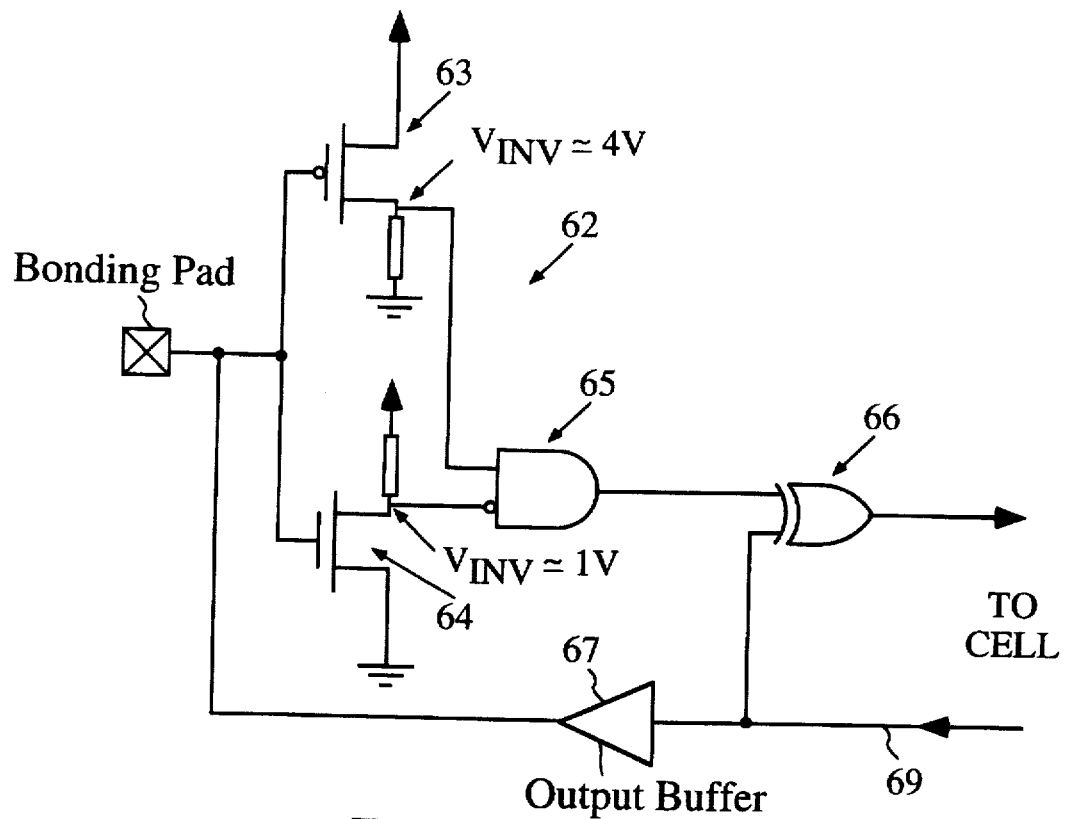
FIG. 13
| Output 1 | Output 2 | Voltage Level |
|----------|----------|---------------|
| 0 | 0 | Low |
| 0 | 1 | Intermediate |
| 1 | 0 | Intermediate |
| 1 | 1 | High |
FIG. 14

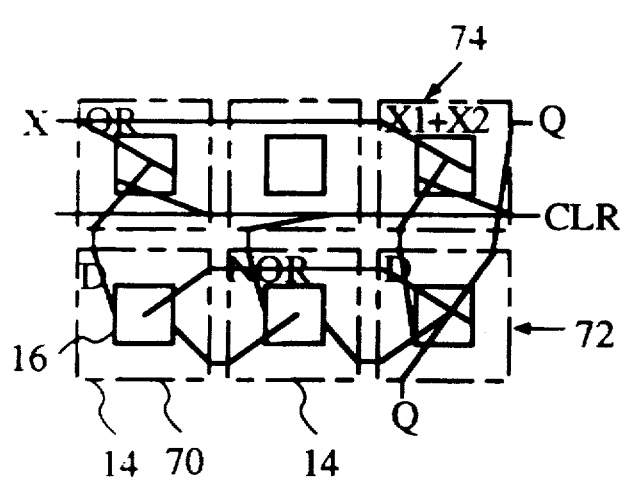
FIG. 17
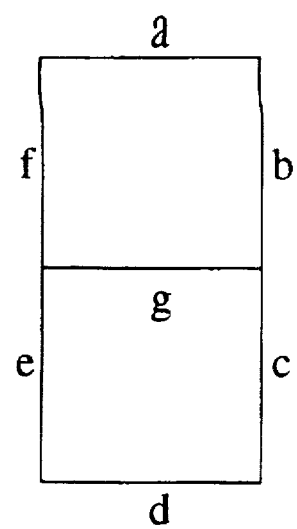
FIG. 18
| INPUT | a | b | c | d | e | f | g |
|-------|---|---|---|---|---|---|---|
| 0000 | 1 | 1 | 1 | 1 | 1 | 1 | 0 |
| 0001 | 0 | 1 | 1 | 0 | 0 | 0 | 0 |
| 0010 | 1 | 1 | 0 | 1 | 1 | 0 | 1 |
| 0011 | 1 | 1 | 1 | 1 | 0 | 0 | 1 |
| 0100 | 0 | 1 | 1 | 0 | 0 | 1 | 1 |
| 0101 | 1 | 0 | 1 | 1 | 0 | 1 | 1 |
| 0110 | 1 | 0 | 1 | 1 | 1 | 1 | 1 |
| 0111 | 1 | 1 | 1 | 0 | 0 | 0 | 0 |
| 1000 | 1 | 1 | 1 | 1 | 1 | 1 | 1 |
| 1001 | 1 | 1 | 1 | 1 | 0 | 1 | 1 |
| 1010 | X | X | X | X | X | X | X |
| 1011 | X | X | X | X | X | X | X |
| 1100 | X | X | X | X | X | X | X |
| 1101 | X | X | X | X | X | X | X |
| 1101 | X | X | X | X | X | X | X |
| 1111 | X | X | X | X | X | X | X |
FIG. 20

```
BLOCK toggle
BPORT Q OUT 2
RPORT Q OUT 1
RPORT CLR IN 1
LPORT CLK IN 1
ENDPORTS
CELL (0,0)
ESOURCE self
X1SOURCE north
X2SOURCE east
FUNCTION dlatch
ENDCELL
CELL (1,0)
ESOURCE west
WSOURCE self
X1SOURCE north
X2SOURCE east
FUNCTION nor
ENDCELL
CELL (2,0)
WSOURCE self
NSOURCE self
SSOURCE self
X1SOURCE north
X2SOURCE west
FUNCTION dlatch
ENDCELL
CELL (0,1)
WSOURCE east
ESOURCE west
SSOURCE self
X1SOURCE east
X2SOURCE west
FUNCTION or
ENDCELL
CELL (1,1)
WSOURCE east
ESOURCE west
SSOURCE east
ENDCELL
CELL (2,1)
WSOURCE east
ESOURCE south
SSOURCE self
X1SOURCE east
X2SOURCE west
FUNCTION r1orr2bar
ENDCELL
ENDBLOCK
```

FIG. 21

CONFIGURABLE CELLULAR ARRAY

This application is a continuation of application Ser. No. 08/116,395, filed Sep. 3, 1993, now abandoned; which is a divisional of application Ser. No. 07/761,835, filed Sep. 13, 1991, now U.S. Pat. No. 5,243,238.

BACKGROUND OF THE INVENTION

1. Field of the Invention

The present invention relates to a configurable cellular array consisting of an array of dynamically configurable logic elements, that is logic elements in which the function realised is dependent on an associated single word of control memory, rather than physical wires connected between logic-elements.

2. Description of Related Art

Configurable logic elements and circuits formed therefrom have been studied for many years. Configurable logic is distinct from microprogramming in that a single long control word is established to control a hardware unit, rather than a sequence of short control words selected from many words in a memory by a sequencer. Normally the hardware unit is significantly more complex in the case of configurable logic. The implementation of the two types is also radically different: in configurable logic. The control and function are intermingled in a single structure whereas in microprogramming the control is provided by a separate unit.

One family of configurable circuits, cellular arrays, as disclosed in a paper entitled "A Survey of Microcellular Research" by R Minnick., J.ACM, 14 (2); 203–241, Published April 1967, have been of particular interest. Most cellular array designs have their function fixed by making or breaking physical wires on an integrated circuit as in conventional logic means, although a system where the function is dependent on a control memory is described in a publication by Richard G. Shoup. Richard G. Shoup, Programmable Cellular Logic Arrays. PhD thesis, Computer Science Dept., Carnegie-Mellon University, March 1970.

Existing programmable cellular arrays suffer from a lack of functional generality caused by limited routing options provided in each cell and because these designs are considered relatively small systems where the entire array was contained in a single chip or built of many chips each containing one or a small number of cells. One reason for this is that these designs are intended to implement subsystems, for example single or multiple output logic functions of several input variables, rather than complete systems. Thus, the lack of flexibility in each cell and the total number of cells available limits the functional generality available. To take advantage of the potentially very large number of flexible cells which can be implemented on a single chip or a multi-chip array with current processing technology, and to allow complete systems of the size currently implemented as application specific integration circuits to be designed with a programmable structure, a more flexible architecture is required. To allow such multi-chip arrays to be built where relatively large numbers of cells are present on each chip such a system must be capable of transferring large numbers of input/output signals between chips.

It is an object of the present invention to provide an improved configurable cellular array which obviates or mitigates at least one of the a forementioned disadvantages.

SUMMARY OF THE INVENTION

This is achieved by providing a 2-dimensional array of cells in which each cell in the array has at least one input and output connection at least one bit wide to each of its neighbours, and each cell also has a programmable routing unit to permit selective intercellular connections to be made.

In a preferred arrangement each cell contains a programmable function unit which includes a plurality of multiplexors. In a preferred arrangement, the function unit and routing unit are programmable using associated Random Access Memory (RAM) areas within the cell. Each cell may be coupled to at least one global or array-crossing-signals so that all cells can be signalled simultaneously. The 2-dimensional array is rectangular and the intercell connections are orthogonal and are one bit wide.

Accordingly, in one aspect of the present invention there is provided a 2-dimensional configurable cellular array comprising a plurality of configurable cells, each cell being connected to each of its neighboring cells in the array by an input connection and an output connection, each input and output connection being at least one bit wide, each cell having a programmable routing unit therein for interconnecting the cell with its neighbours in the array, each programmable routing unit being capable of selectively routing one of a set of input signals to a cell output.

Preferably, each cell includes a programmable function unit coupled to, and functionally within, the routing unit, the programmable function unit having a plurality of multiplexors arranged to combine input variables to the cell. Advantageously, the programmable function unit and the programmable routing unit have Random Access Memory areas associated therewith.

According to another aspect of the present invention, there is provided a 2-dimensional configurable cellular array comprising a plurality of configurable cells. Each cell has an input and an output connection at least one bit wide to each of its neighbors. Each cell also has a programmable routing means consisting of a plurality of multiplexors disposed therein, the RAM programmable routing means being coupled to each of the cell inputs and outputs, and RAM programmable function means disposed within each cell with the RAM programmable function means being coupled to, and functionally within, the programmable routing means for receiving at least some inputs or variables from the programmable routing means and for combining the input variables to provide a function unit output signal.

Preferably, the 2-dimensional array of cells is rectangular and each cell is connected to its neighbouring cells by orthogonal connections. Alternatively, each cell may be connected to its neighbouring cell by diagonal connections.

Preferably, the programmable function unit includes a plurality of multiplexors for performing the combination of said variables.

Advantageously each cell in the array is coupled to at least one global signal source so that all cells in the array can be signalled simultaneously. Alternatively, array crossing signals may be connected to all cells on a row, column or a diagonal of the array. Conveniently, the global or array crossing signal is taken from the output and connected to inputs of a function unit.

According to another aspect of the present invention a configurable cellular array comprises a plurality of cells arranged in a 2-dimensional format so that, apart from those cells at the edges of the array, each cell has only four orthogonally arranged neighbouring cells to each of which it is respectively connected with only one input and output connection, wherein each is only one-bit wide. Each cell comprises a programmable routing unit having a plurality of multiplexors and a programmable logic function unit having a plurality of multiplexors, the logic function unit having two inputs derived by a first set of multiplexors of the routing unit from the input connections to the cell and having only one output which is delivered within the cell as an input to a second set of multiplexors of the routing unit of the cell. The second set of multiplexors is arranged to selectively route the logic function unit output to each of said four neighbouring cells, and to route selectively the input from each neighbouring cell to each other neighbouring cell. Each multiplexor of the routing unit is programmable and most multiplexors of said logic function unit being programmable by bits of a control word from an associated cell memory which word is retained during the operation of the array.

Preferably, the multiplexors are mostly 4:1 and controlled by only 2 bits of said control word. Preferably the first set of multiplexors are two in number.

Preferably, the second set of multiplexors is equal to the number of cell outputs. Conveniently there are 4 multiplexors in the second set.

Preferably, the array has at least one common signal line connected as an input to a set of cells of the array, only said first set of multiplexors of the routing unit of each cell being connected to said common signal line.

Preferably, the cell set is a row or a column or a diagonal. Alternatively, the cell set is all cells of the array.

Preferably, the function unit output is fed back to at least one of the multiplexors within the function unit so a latch is created within the cell. The provision of a latch within the cell means that sequential operations may be supported. The logic function unit includes at least three multiplexors with at least one inventor which are organised according to the bits of the program control word to provide at the logic function unit output any useful number of the 16 possible combinational functions of 2 input variables.

The logic function unit output from each cell in the array is also programmably connected to a global signal extending to the edge of the array to allow monitoring of each cell function unit output using an address of said associated cell memory.

According to a third aspect of the present invention there is provided a configurable cellular array integrated circuit having a substrate, p and n-type diffusion zones thereon, a deposited layer of polysilicon and first and second metal layers characterised in that the polysilicon layer is deposited as a series of continuous parallel strips extending in a first direction and the p and n-type zones and said second metal layer are deposited in strips extending in the orthogonal direction; and the first metal layer is laid in strips extending in both directions.

Conveniently, the circuit includes an associated cell memory which is a RAM and which is formed in one part of the circuit. The RAM cell memories are programmable by first control signals carried on the polysilicon and by second control signals carried by the second metal layer.

Preferably the p and n-type zones, and the first metal layer are discontinuous strips. Advantageously, the strips of the second metal layer are continuous. Conveniently, the circuit is fabricated using a double metal single polysilicon N-well CMOS process.

These and other aspects of the present invention will become apparent from the following description when taken in combination with the accompanying drawings.

BRIEF DESCRIPTION OF THE DRAWINGS

FIG. 4 is a schematic diagram of one embodiment of a programmable function unit present in each cell in the array in accordance with an embodiment of the invention for supporting sequential operations;

FIG. 5 is a routing table depicting the programming of the function unit shown in FIG. 4 and illustrating the output function for various combinations of inputs;

FIG. 12 depicts a schematic diagram of a pad sharing scheme for sharing an input and an output from 2 chips on a single pad;

FIG. 13 is a circuit for sensing the value of the signal which a neighbouring chip is trying to pass to it;

FIG. 14 is a table depicting the voltage levels at the pad for various output conditions of the chips sharing the pad;

FIG. 17 is a diagram of a one toggle counter of a 4-bit counter used with the cell array of FIG. 1;

FIG. 18 is a seven segment display element to be driven by a decoder;

FIG. 20 is a truth table for implementing the operation of decoder of FIG. 19 to drive the display element;

FIG. 21 is textual representation of user designed interconnections in a cellular array in FIG. 16

DETAILED DESCRIPTION OF THE DRAWINGS

Figure 1:
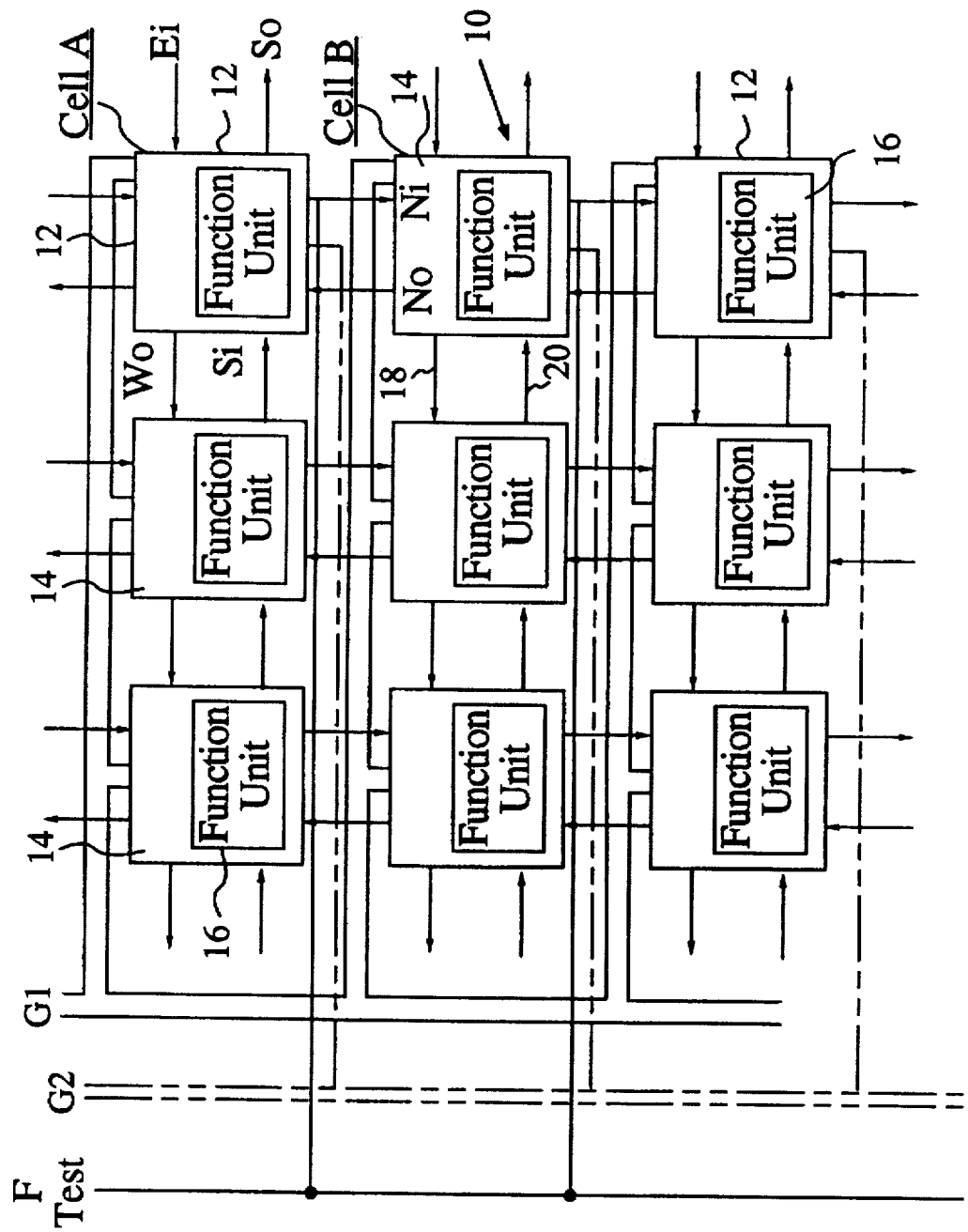
FIG. 1 depicts a 2-dimensional configurable cellular array consisting of an arbitrarily sized rectangular array of cells in accordance with an embodiment of the present invention.

Reference is now made to FIG. 1 of the drawings which depicts a 2-dimensional 3×3 rectangular cellular array generally indicated by reference numeral 10 which consists of 9 identical cells 12, each cell containing a programmable routing unit 14, a function unit 16 and inventors (not shown). The cells 12 are connected orthogonally to each neighbour by inputs 18 and outputs 20. It will be understood that the function unit 16 and routing unit 14 have associated areas of memory within the cell, as will be later described particularly with reference to FIG. 11.

The structure and operation of the programmable routing unit 14 and the function unit 16 as well as the configurable cellular array 10 will be described later in detail. In this embodiment, global signals G1 and G2 are connected to each cell 12 in the array 10, only some of the connections being shown in the interests of clarity. Typically, signals G1, G2 are clock signals.

Figure 2:
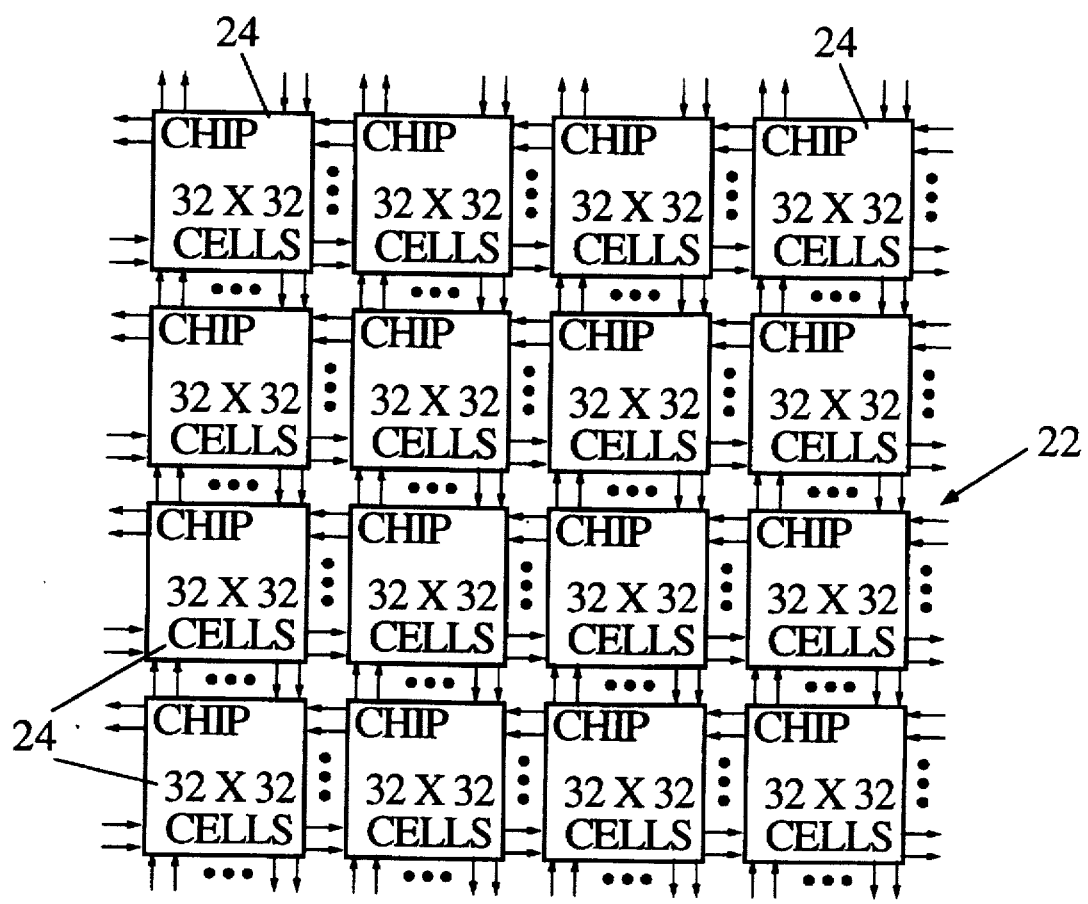
FIG. 2 depicts general array composition consisting of rectangular array of chips each of which contains a fixed size array of cells.

FIG. 2 of the drawings depicts an example cellular array 22 which is built up from a rectangular array of chips 24, each chip in the array containing a fixed size 32×32 array of cells connected together on a printed circuit board, silicon wafer or other suitable substrate.

Figure 3:
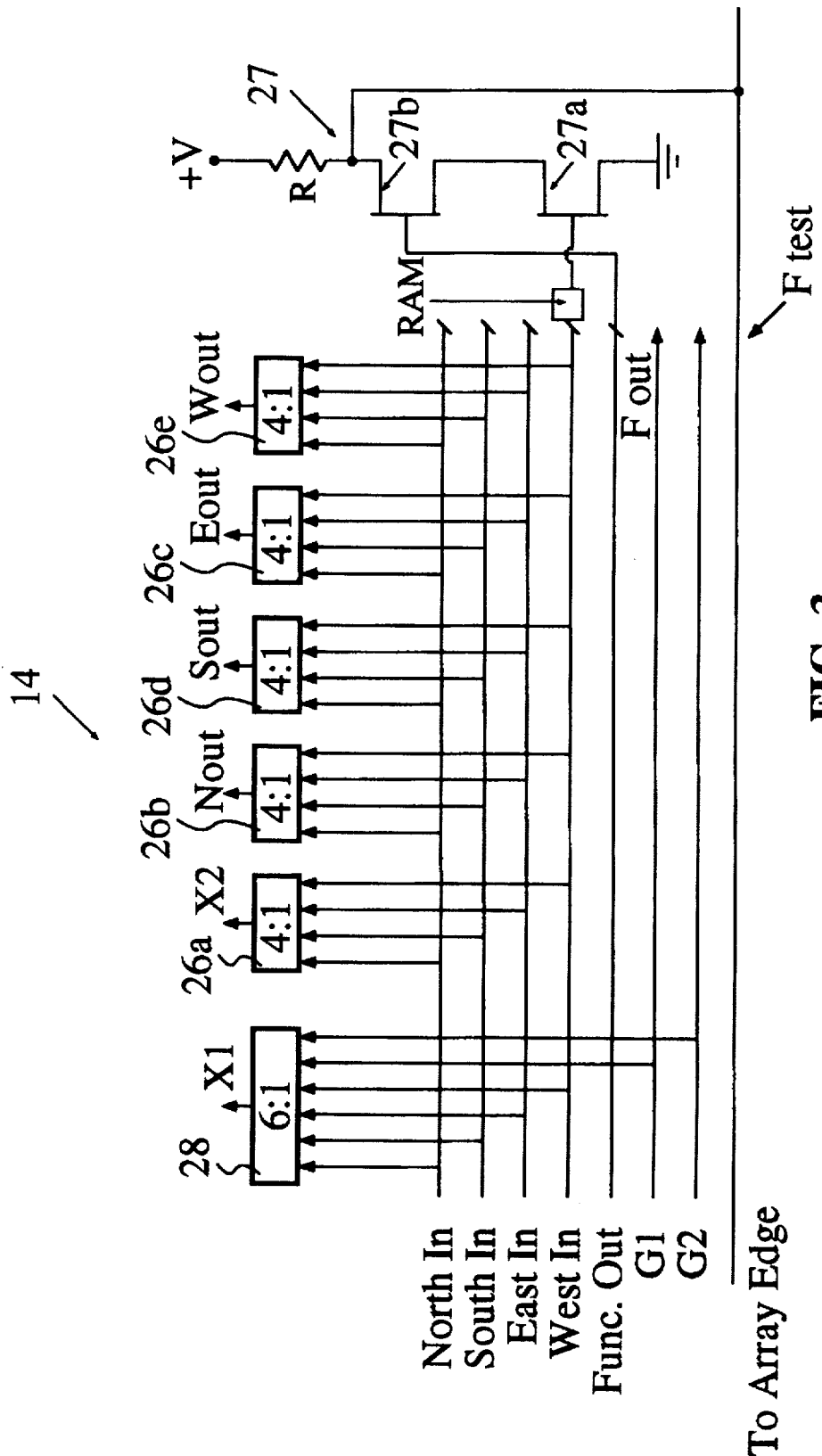
FIG. 3 is a schematic representation of an embodiment of programmable routing unit incorporated in each cell of the array.

Reference is now made to FIG. 3 of the drawings which depicts an embodiment of a programmable routing unit 14. In the cell 12 as will become clear, the routing unit 14 functionally, but not physically, surrounds the function unit 16. All signals to and from the cell 12 must pass through the routing unit 14 which consists of five, 4:1 programmable multiplexors 26a to 26e and one programmable 6:1 multiplexor 28. 6:1 Multiplexor 28 and 4:1 multiplexor 26a form a first set of multiplexors for deriving two inputs $X_1$, $X_2$ for the function unit of the cell from the inputs to the cell and global signals G1, G2. Each of the 4:1 programmable multiplexors 26a–26e has 4 inputs which allows them to be controlled by only 2 bits of a control word from a RAM area. Multiplexors 26b to 26e are neighbour routing devices and form the second set of multiplexors. Each neighbour routing multiplexor has the input corresponding to its output direction removed to avoid redundant permutations as will be later explained. The second set are arranged to route selectively the logic function unit output to each of the four neighbouring cells and to route the input from each neighbour cell to each other neighbour cell. It will also be appreciated that in this example signals G1 and G2 are global input signals which are connected to all cells 12 in the array 10. In this example G1 and G2 are intended for use as a 2-phase non-overlapping clock and, as can be seen from FIG. 3, as such are only connected to the function input selector 6:1 multiplexor 28. In this diagram, routing unit output signals X1 and X2 represent the 2 inputs to the programmable function unit 16 within the cell.

The function output is connected to a function unit output buffering circuit 27. The function unit logic level is monitored by connecting an associate RAM cell output to a first transistor 27a and the function unit output to a second in series transistor 27b as seen in FIG. 3. By programming the RAM with a bit of the control word transistors 27a and 27b can be caused to conduct when the function output level switches 27b ON. This pulls down the voltage level on F-test line 29, which extends to the edge of the array, so that the function unit output can be monitored. This procedure can be repeated for any cell of interest within the array by programming the appropriate RAM.

Reference is now made to FIGS. 4 and 5 of the drawings which depict an embodiment of a programmable function unit 16 and its associated routing table respectively for determining the function output for various inputs. Before describing the function unit in detail, it should be understood that the design of programmable function units for cellular arrays has been the subject of considerable study in the context of arrays where the programming is done by making or breaking of physical wires. It should also be understood that many of the techniques developed for such arrays can be adapted for dynamically programmed arrays and it is considered advantageous for only a small number of inputs to the function unit at present to allow any combinational function of the input variables to be computed. A design for a multiplexor based function unit capable of implementing all functions of 2 variables and its programming table has been described by X.Chen and S. L. Hurst. "A comparison of universal-logic-module realisations and their application in the synthesis of combinatorial and sequential logic networks" IEEE transactions on computers, 31(2): 140–147, February 1982.

One problem with the Chen et al., combinational function unit design is that it is unable to support sequential operations and from the point of view of performance and reliability (synchroniser failure)in configurable systems it is advantageous to implement basic latches as a within-cell function rather than using several cells to minimise delay and minimise risk of loss of synchronisation. Also, previous designs have supplied a separate sequential unit with additional selectors within the function unit to choose between these sequential combinational units. This technique requires extra area and the additional selectors increase the delays through the cells.

The function unit shown in FIG. 4 overcomes these problems when operated in conjunction with the routing table of FIG. 5. This arrangement allows more efficient use of control store than the use of a separate sequential unit and reduces the path delay through the cell. From FIG. 4 it will be seen that 2 programmable 4:1 multiplexors 30 as well as three 2:1 programmable multiplexors 32 are used, as the structure F is a 2:1 programmable multiplexor. The structure F is controlled by the signal from Y1 and is different from the other multiplexors in that the data signal from multiplexor 32 (y1) acts as a control signal. The output 33 is fed back to multiplexor 32 (Y3) to provide latching as a single cell function and to support sequential operation. From the table of FIG. 5 it will be seen that all 16 functions of 2 variables $\bar{X}1$ and $\bar{X}2$ are implemented within the function unit 16. In addition feedback of the function output signal to the 2:1 multiplexor 32(Y3) allows D latching operations to be performed as seen in line numbers 16 to 19 of the FIG. 5 table. The $X_1$, and $X_2$ input are obtained by inverting the outputs of multiplexors 28, 26a respectively using inventors at the input of multiplexors 32, 30 respectively. The other inputs '1', '0' to multiplexors 30 are derived from the high power rail (1) and ground rail (0).

Figures 6, 7:
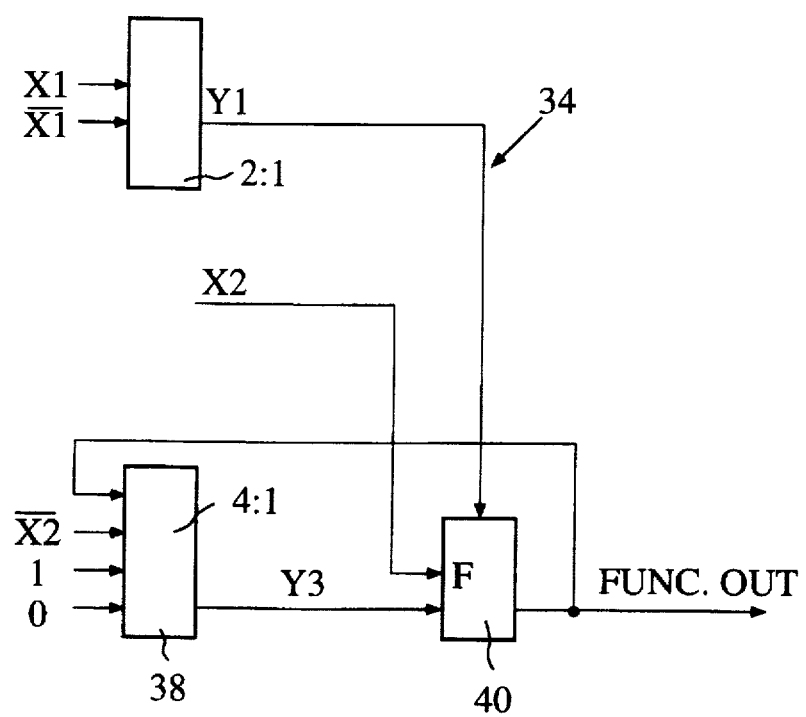
FIG. 6 depicts a schematic diagram of an alternative function unit which may be used with each cell in the array
FIG. 7 is a routing table for implementing the functions of the unit shown in FIG. 6.

An alternative embodiment of a function unit 34 is shown in FIG. 6 with its associated logic table shown in FIG. 7. Function unit 34 differs from unit 16 in that the critical path through the function unit has been reduced and 3 bits of programming information have been saved over the previous design. With a configurable array it does not matter whether a particular wire is carrying a signal or its inverse because the function computed by the cell which uses the signal as an input can be altered to take account of the inversion. For example, if it is wished to comput A.B at a given cell but it is known that $\bar{A}$ rather than A is being received $\bar{A}$,B is implemented instead. Thus if we divide the 16 functions into two sets of eight functions such that the functions in the second set are the inverse of functions in the first set, only one of the sets needs to be implemented. At the periphery of the array programmable output pads, inversion are compensated for so the correct values are output to external circuits. Alternatively, the function units of cells near the edge of the array can be used to provide a compensating inversion. It is normal for such spare cells to exist in designs because the size of array required for a particular task is unlikely to be exactly the same size as the physical array provided. The simple functions O, X1 and X2 can be generated with the non-trivial two input logic functions XOR and OR by using the X1 and X2 input selection multiplexor 26, 28 as shown in FIG. 3 to route the same cell input to both X1 and X2. Thus, only 5 combinational logic functions need actually be implemented in the function unit 34 to support designs which use all 16 possibilities. It will be appreciated that two sequential functions: D latches with active high and active low clocks are also provided but latches with inverted Data inputs are not necessary since the system can cope with inverted outputs as described above.

Figures 8, 9:
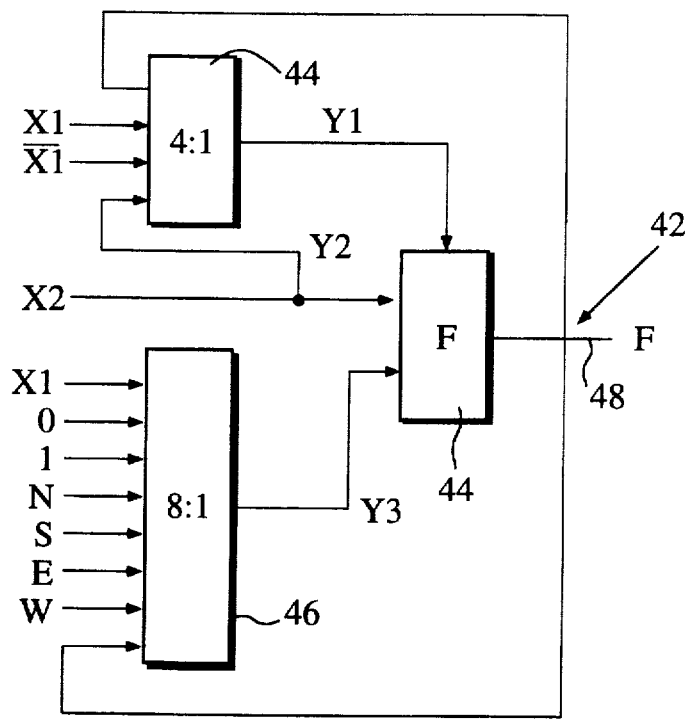
FIG. 8 is a schematic diagram of a further embodiment of a function unit in accordance with the present invention for use with each cell in the array.
FIG. 9 is a routing table showing the programming arrangements of the function unit in FIG. 8.

Another embodiment of a function unit is depicted in FIG. 8 in which the function unit, generally indicated by the reference numeral 42, consists of a programmable 4:1 multiplexor 44 and a programmable 8:1 multiplexor 46 which feed outputs Y1, Y2 and Y3 to a programmable 2:1 multiplexor (F) 48 from which the output F is taken. The output F is fed back to form an input of multiplexor 44 and multiplexor 46. The routing table shown in FIG. 9 represents the output F from the programmable function unit 42 for various combinations of inputs to the multiplexors 44 and 46. In function 5 multiplexors Y2 and Y3 must both select some input. In this design, multiplexor Y3 can select all neighbour inputs. This second feedback path allows RS latches to be implemented as well as D latches as can be seen from FIG. 9. Because the Y2 and Y3 multiplexors 46, 48 can now select different neighbour inputs the 3 input 2:1 programmable multiplexer function can also be implemented. RS latches and programmable 2:1 multiplexors are quite common in user design and implementation as cell functions provide performance advantages. Additional multiplexors are shown connected to other selection multiplexers, for example Y3 can now select X1 as an input and this allows all cell functions to be computed with global signals as inputs because only X1 can select global signals as will be evident from studying FIG. 3.

Figure 10:
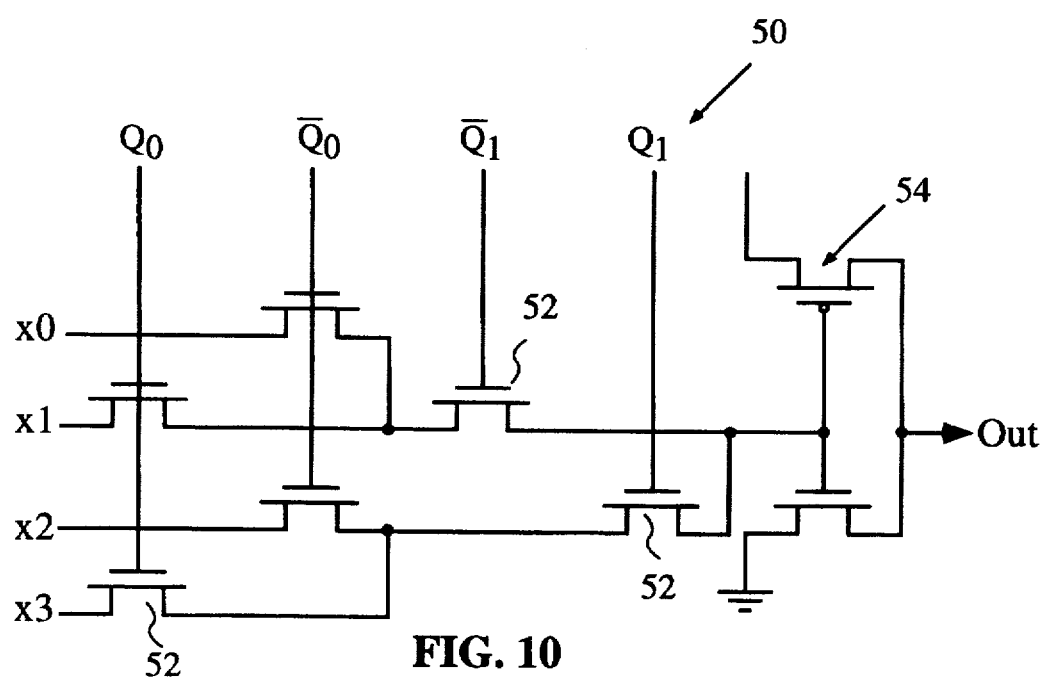
FIG. 10 is a circuit diagram of a RAM controlled multiplexor for use with the programmable routing unit and functions units shown in FIG. 3 to 9.

Reference is now made to FIG. 10 of the drawings which depicts a circuit diagram of a RAM controlled programmable 4:1 multiplexer generally indicated by reference numeral 50. Signals labelled $X_0$, $X_1$, $X_2$ and $X_3$ are multiplexer inputs, and signals $Q_o$, $\bar{Q}_o$, $Q_1$, and $\bar{Q}_1$ are from controlling RAM cells, which are not shown in the interest of clarity. Only 4:1 programmable multiplexors are considered but it will be understood that the techniques described can be extended to other sizes of multiplexor. It is also apparent that there are many possible modifications of this structure; for example, multiplexors based on transmission gates, single switches controlled by 4 RAM cells or logic gate multiplexors may be implemented. Single switch based multiplexors could be advantageous if smaller 3 transistor RAM cells are used. In the circuit shown in FIG. 10, six transistors 52 are used to create the multiplexor and a single inventor, generally indicated by reference numeral 54, is disposed at the output of the circuit so that the output of the multiplexor is inverted. Inverting multiplexors are smaller and faster than non-inverting ones which require two inventors at the output. This means that in a path through several cells between a function unit output and another function unit input the value of the signal transmitted could be inverted, if there were an odd number of routing multiplexors on the path. Normally, this would lead to erroneous computations being performed, however, in the case of configurable array logic a computer program which generates configuration information for a design can automatically compensate for inversion caused by routing multiplexors by changing the function of the cell which receives these inversions as its input.

Figure 11:
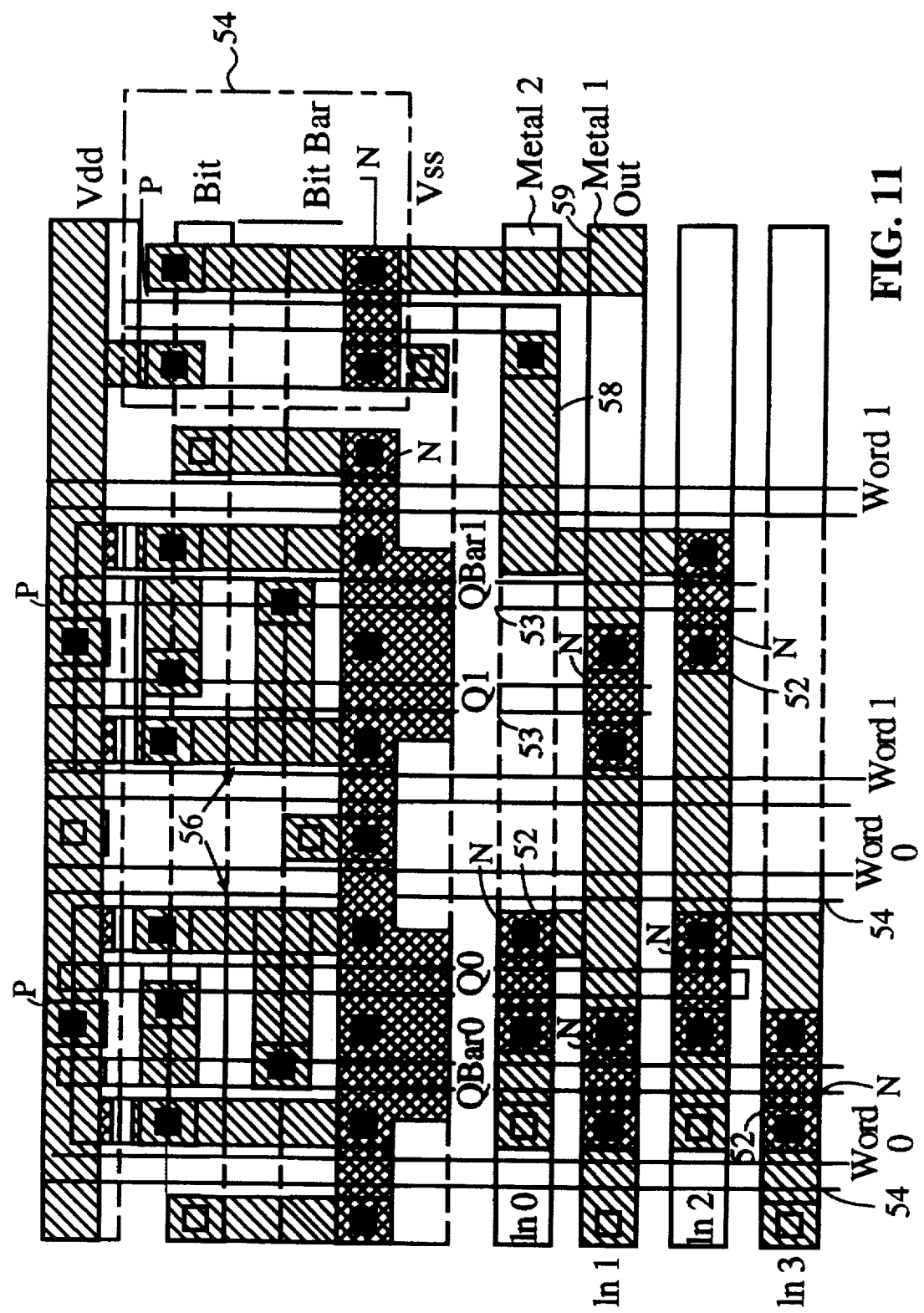
FIGS. 11 and 11a are a diagrammatic plan view of the realisation of the multiplexor of FIG. 10 in a standard double metal, single polysilicon n-well CMOS process and a circuit diagram of a 6 transistor RAM cell.

Reference is now made to FIG. 11 of the drawings which depicts a realisation of the multiplexor shown in FIG. 10 from a double metal single polysilicon n-well CMOS process. The manufacturing process is a conventional process as explained in detail in a book entitled "Principles of CMOS VLSI design, a Systems Perspective" by Nell Weste and Kamran Eshraghian published by Addsion-Wesley publishing company in October 1985 which is a standard text book on the subject of CMOS design and fabrication techniques.

In FIG. 11, the N-type and P-type diffusion zones have been laid out on the substrate generally horizontally. The polysilicon tracks are laid down at right angles to the direction of the diffusion zones and are indicated by reference numeral 55. As is described in the above-referenced book, first and second metal layers, metal 1 and metal 2 respectively, are deposited over the polysilicon and P and N-type zones in accordance with standard techniques to create the arrangement shown in FIG. 11. It will be understood that the metal 2 layer is thicker and is of a higher conductivity than metal 1 and so it can be used to carry more current.

Figure 11A:
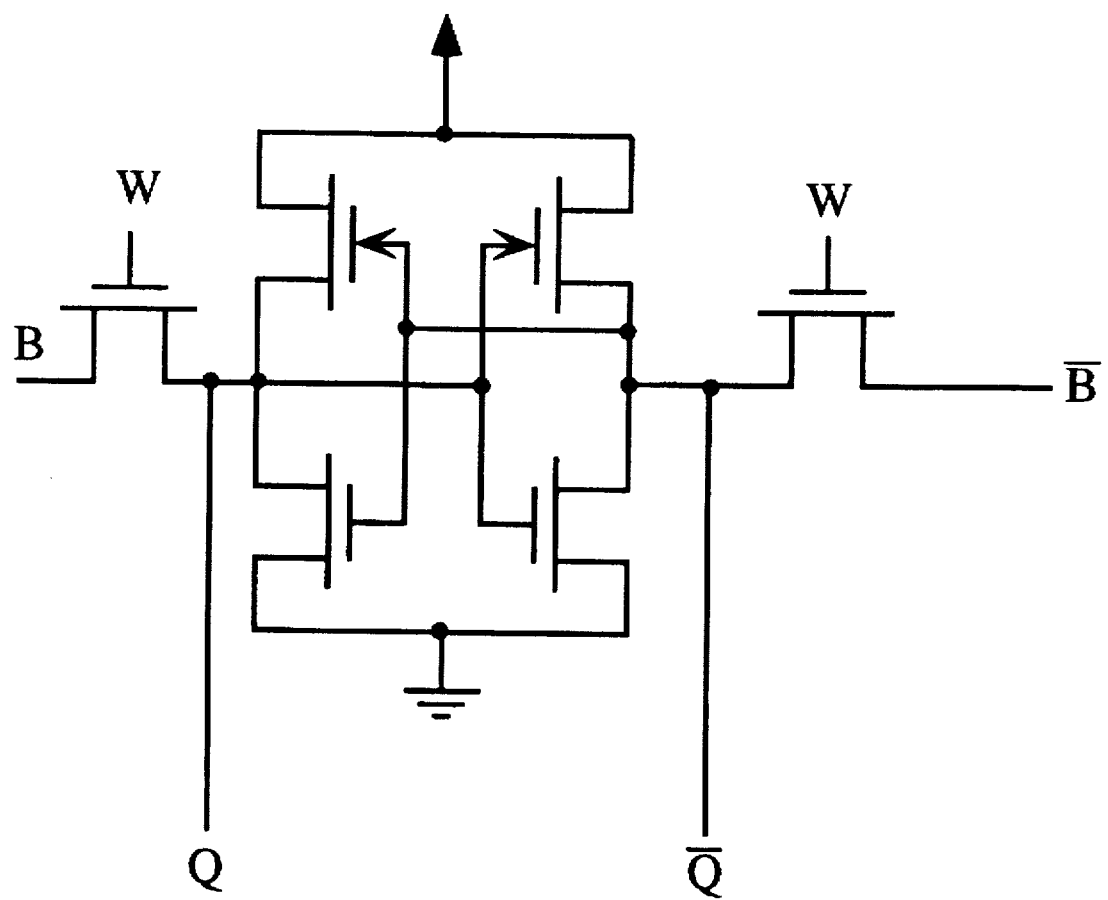

It can be seen from FIG. 11 that the metal 2 layer is laid orthogonally to the polysilicon layers 53, 55 and the metal 2 layer extends across the width of the cell to the edge of the array to facilitate programming of RAM cells and passing signals to the multiplexor as will be later explained. It will also be seen that the polysilicon layers 53, 55 although extending across the height of the cell in the case of word lines do not always do so. In fact some have a shorter length when they are used to carry $Q^1$ and $\bar{Q}^1$ output signals and these are indicated by reference numeral 53. With reference also to FIG. 10 the transistors 52 are shown as N-type and are the darker areas on the diagram and the RAM cells are generally indicated by reference numeral 56, best seen in FIG. 11a. The output of the multiplexor is taken on the metal 22 layer 58, and provided to the inventor 54 which is generally shown in the dotted area and the output connection is at terminal 59 and the operation of the multiplexor and associated store is as described above with reference to FIG. 10.

It will be understood that the RAM's are programmable by the first set of control bits shown as word 0 word 1 which extend as described above across the height of the cell. This means that the pass transistor associated RAM logic is disposed beneath the metal routing wires metal 1 and metal 2 which are necessary to implement the routing configuration shown in FIG. 3. The power, word and bit lines for the RAM do not interfere with the wiring functions required to implement the cell routing and function areas. In order to set the RAM to a particular value a control bit is passed along polysilicon line 55 and associated RAM control bits are passed on the metal 2 bit lines so that this 2-dimensional XY "signalling" sets the state of a particular RAM cell thus controlling the output of the RAMS to its associated multiplexor. This arrangement allows for very compact implementation of control store and multiplexors.

In the configurable cellular array architecture as indicated above it is possible to fabricate relatively large arrays of cells on a single chip. All peripheral connections must be communicated to neighbouring chips to permit multi-chip arrays to be built as shown in FIG. 2 so that a large number of package pins are potentially required. Because packages with sufficient pinout are expensive it may be necessary to multiplex several logic signals on to a single physical wire. An alternative is necessary to share a single pad between 2 signals to meet reasonable pinout restrictions.

One embodiment of a pad sharing scheme is shown in FIG. 12. In this case an input and an output from a single cell are connected to a single pad. When the neighbouring chip (chip.2) is also similarly connected to the wire 60 there are then three possible voltage levels on the wire. This is illustrated by the table shown in FIG. 14. When the two chips attempt to output opposite values contention will occur and the voltage on the external connection will be at an intermediate level. Each chip senses an intermediate state in the wire and knows what level it is attempting to output. This is achieved using the circuit 62 in FIG. 13. In this circuit comparator 63 only passes a signal from chip 1 if the signal is less than +4 v and comparator 64 also passes the signal if it is greater than +1 volt. The AND gate 65 then passes a signal when both inventor output signals are high. As this denotes contention it is opposite to the signal on line 69 and the XOR gate 66 passes a signal opposite to that on cell output line 69 back to the input of the cell. The output buffer 67 is important because it is designed to minimise power consumption in the contention state and isolates the cell from off chip transients.

An example of a specific circuit design will now be described using the configurable cellular array. Reference will also be made to FIG. 11 of the drawings to facilitate understanding. This design is typical of the type of system that would fit onto a single configurable logic array (CAL) chip in an electronic programmable logic device (EPLD) application. The example given is that of a digital stopwatch which-is designed to count up in tenths of a second to one minute and to display the current time on three seven segment displays: tenths of seconds, seconds, and tens of seconds. The watch is controlled by three signals:

1. INIT which clears the stopwatch to zero and puts it in the 'stop' state.
2. SS Start/Stop. A high going edge in the "stop" state starts the watch counting. A high going edge in the 'start' counting state puts the watch in the 'stop' state.
3. CLOCK. 10 Hz clock signal.

In this example the seven segment decoders provide a good example of "random" combinational logic whereas the counters provide a good example of classical sequential logic.

Figure 15:
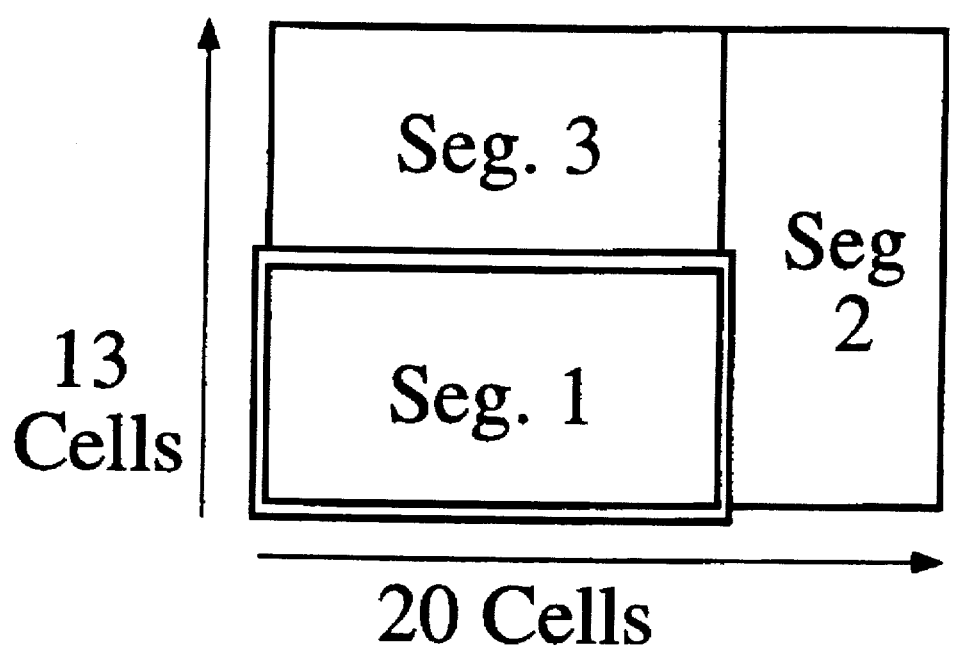
FIG. 15 is plan of a digital stop watch circuit implemented by the configurable cellular array architecture in accordance with the present invention.
Figure 16:
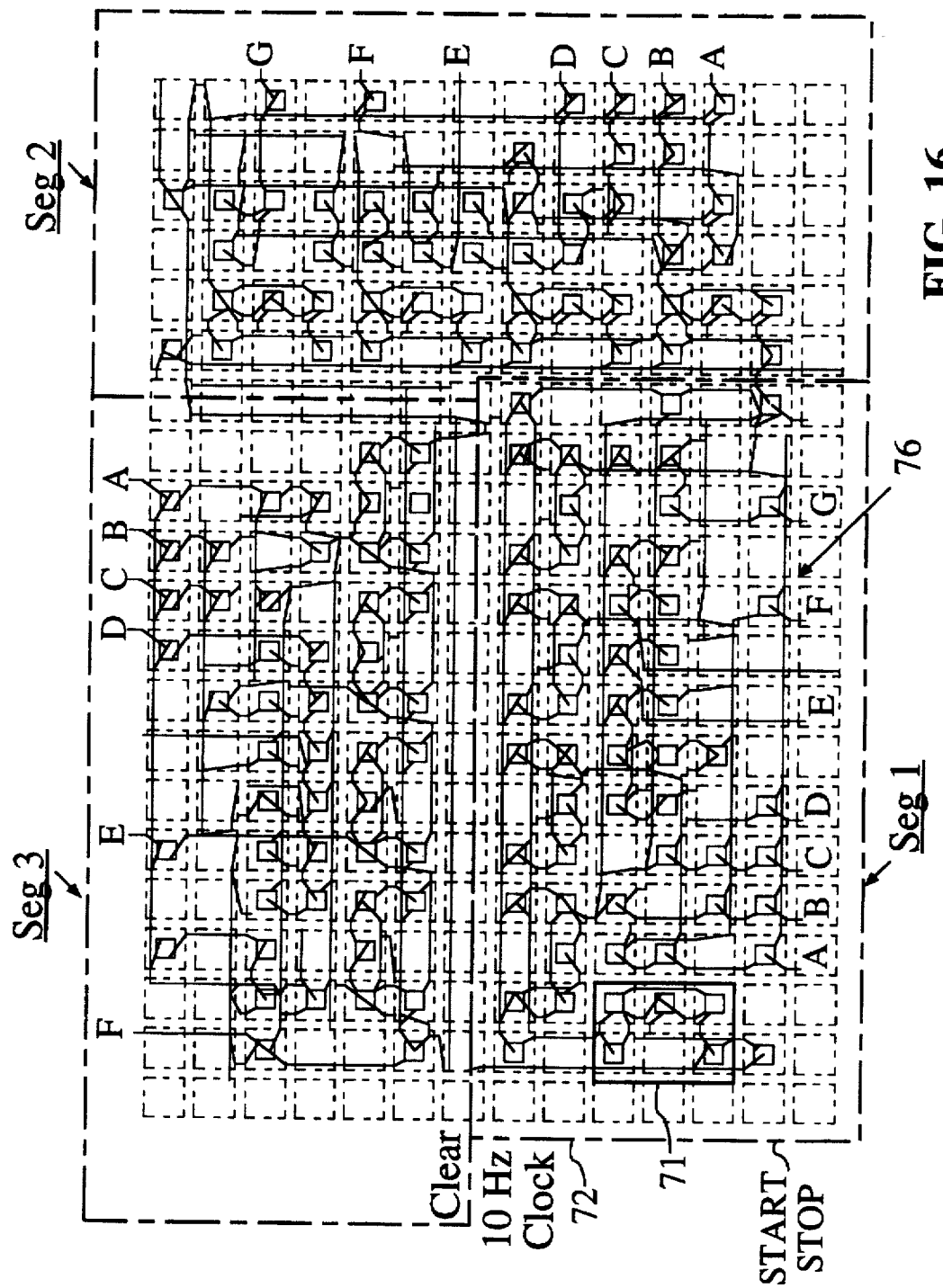
FIG. 16 is a schematic diagram of a cell array for the floor plan of FIG. 15.

The floor plan for the full watch circuit is best seen in FIG. 15, which requires three separate units, segment 1, segment 2 and segment 3 for each of the 3 seven segments displays one of which is shown in FIG. 18. The complete circuit requires a rectangular array of 20×13 cells and the array layout is shown in FIG. 16.

To facilitate understanding segment 1 will be considered. Segment 1 contains four counters 70, a controller 71 and a decoder 72. One of the counters 72 is shown enlarged in FIG. 17. It can be seen that each counter is made up of 6 cells arranged and the complete counter is actually built from 4 toggle flip-flops. Thus, the basic 4-bit ripple counter is converted into a decade counter by a gate (not shown) which sets the clear line when the counter gets to 10. This is best illustrated by reference to Fla. 20 which is a truth table of the counter logic using the segment labelling of FIG. 18. The output of this gate is also used as a clock for the succeeding counter. The counter 72 can also be cleared by the INIT signal. In a toggle flip-flop, the basic D latches have only clock and D inputs and the clear is provided by extra logic gates which force zeros into the D inputs and 1 onto the clock inputs.

The counter shown in FIG. 17 is designed by a user using textual input language as shown in FIG. 21. Note that the programming model is implemented by a combination of translation programs and CAL devices: many of the routing permutations and cell functions supported by the programming model are redundant and are not directly implemented by the hardware. None of the transformations used increase delays or change functionality. This data sheet will not cover the programming of CAL devices in detail but C source code for the translation programs will be made available. There are 5 basic steps in the translation process:

1. Cell Assignment. In this step the user's design is first flattened to eliminate hierarchy. The array of cells comprising the design is then placed within the (probably larger) physical array provided and extra routing is added as necessary to make connections to the edge of the physical array. After this stage, each cell in the user's design has been assigned to a particular cell within a physical array.

2. Design Verification. In this step, design errors such as dangling inputs to logic elements are checked for and appropriate error messages generated. As well as checking for errors, unnecessary wiring or functional units (e.g. gates whose output is not used elsewhere) are deleted since they could increase power consumption.

3. Desjan Transformation. In this step, redundant permutations and functional possibilities within the programming model are removed resulting in a design which can be implemented on the physical array. In the programming model, for example, cell's can route north input to north output, however, this is not necessary since the cell to the north must already have the appropriate variable available on another input. Thus, the transformation program can always produce an equivalent configuration in which this connection is not required.

4. Assignment of Unused Resources. In this step, physical resources not used in the user's design are assigned default values chosen to minimise array power consumption. At this stage, warning of potential power dissipation problems in highly concurrent user designs may be given. Note that the system cannot determine whether such problems will occur since that is not dependant only on the array configuration but can detect the potential for such problems.

5. Programming. In this stage, a binary file suitable for programming the CAL is generated. The program uses tables which contain information about the physical structure of the CAL chip to locate the control store for individual multiplexors within the RAM array and suitable values to force the correct inputs to be selected. This type of programming is similar to that used in CAD programs for I.C. design by a person skilled in the art.

In the cells 14 shown, the square is the function unit 16 and the function output is shown coming from the square centre. Cell (0,0) is a D latch and has a N input ($X_1$) and an East input ($X_2$). This layout can be seen using the function unit shown in FIG. 3. Therefore from the table of line 16, for the D latch $X_1$ is the clock, and $X_2$ is equal to D. The cell is programmed as described above using the integrated circuit of FIG. 11 by writing the control word bits into the memory and in fact all cells in one part of the array receive control word bits and are programmed. When the connections are made they are as shown in black lines in FIGS. 17.

Figure 19:
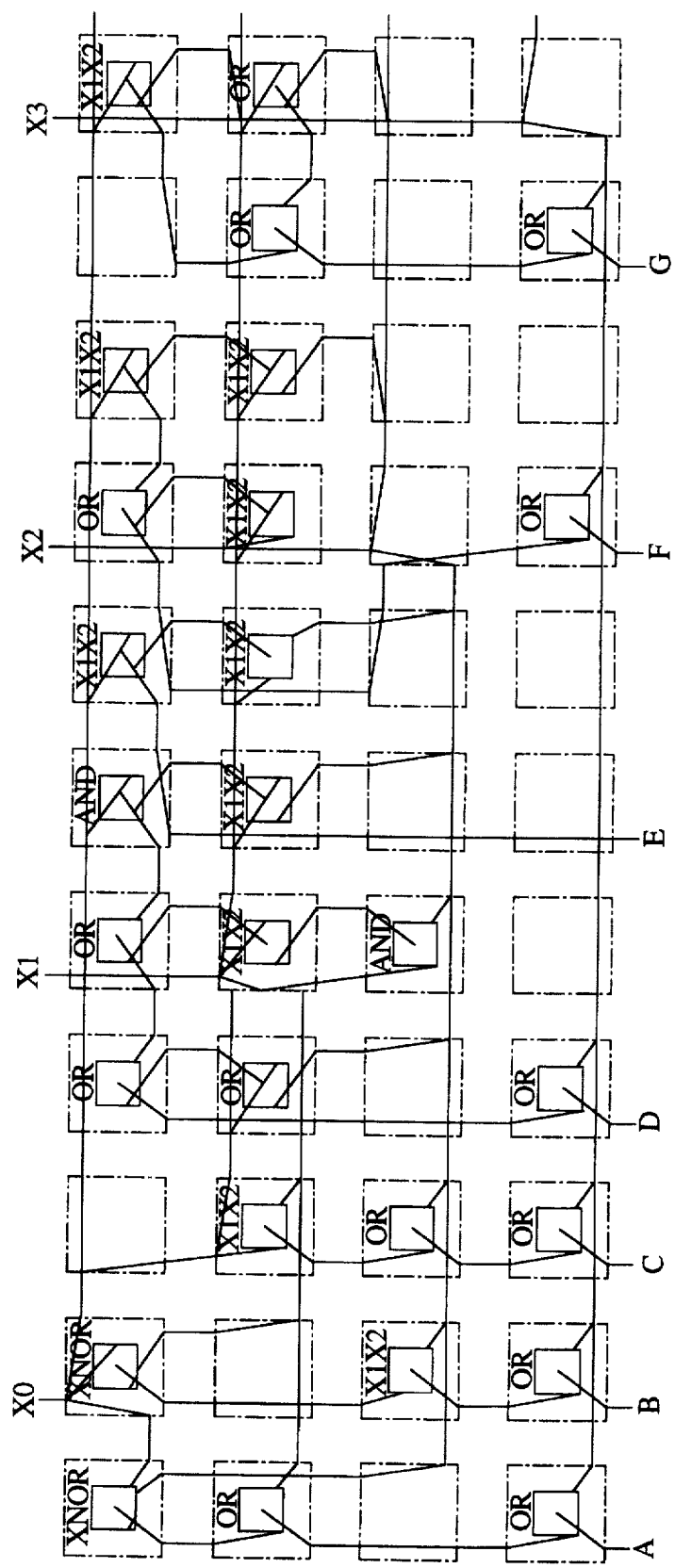
FIG. 19 shows the decoder used to drive the seven segment display element of FIG. 18.

Reference is now also made to FIG. 19 which is the cellular layout for the decoder 76 shown in FIG. 16. The decoder 76 takes advantage of the ability to produce any function of two boolean variables within one cell and uses several levels of logic-rather than the 2 level logic normally used to implement such functions. From the truth table shown in FIG. 20 it can be seen that specific segments of the display element in FIG. 18 are energised to indicate a number in accordance with a predetermined input code. For example, to create the numeral 2 on the display segments a, b, g, e and d have to be energised and this is achieved by decoder digital input signal, 0010 from the four counter outputs.

The controller function of the segment 1 layout is implemented using a toggle flip-flop generally indicated by reference numeral 77 which is at the bottom left of FIG. 16. The design is the same as those with the counters 72. The toggle flip flip 77 is clocked by the start/stop input and its output determines whether the counter should be stopped or run freely. The initialised (INIT) signal clears the control flip flop and stops the counter. The counters are stopped by And'ing the 10 Hz clock with the output of the control flip flop so that when the output of the control flip-flop is zero the counter's clock input is held low and when it is '1' the counters receive the 10 hertz clock input. Various modifications may be made to the configurable cellular array and its associated structures hereinbefore described without departing from the scope of the invention, for example, it will be appreciated that the routing unit may be constructed using other arrangements of programmable multiplexors, for example 6:1 and 5:1 multiplexors. 5:1 multiplexor requires three bits of control store and which could potentially select between eight different sources. Such arrangements are therefore inefficient and 4:1 multiplexors are preferred because these only require two bits of control store.

In general, it is advantageous to use multiplexors where the number of inputs is a power of two in order to make maximum use of control store. It will also be appreciated that array crossing wires travelling vertically, horizontally or diagonally across the array may be added to the basic design. In particular, a further modification is that the array crossing wires may be of finite length so that only a finite number cells connected by an array crossing are in a row, column or diagonal. These signals can cross a whole array, a single chip or a small part of a single chip, for example eight cells. Where these signals are segmented extra structures, which are not part of the basic repeating cell, are provided to allow adjacent signals to be collected together to form longer wires. Alternatively, function units or routing resources may be used to provide this connection. Such input signals can be connected to the function unit input selector in the same manner as the G1 and G2 global signals mentioned above or to other suitable inputs within the cell such as neighbour multiplexor or multiplexor within the function unit. Such output signals can be connected to the cells function unit output in the same manner as a global signal mentioned above or to other multiplexor within the cell, or to new multiplexors dedicated to this purpose.

Figure 22:
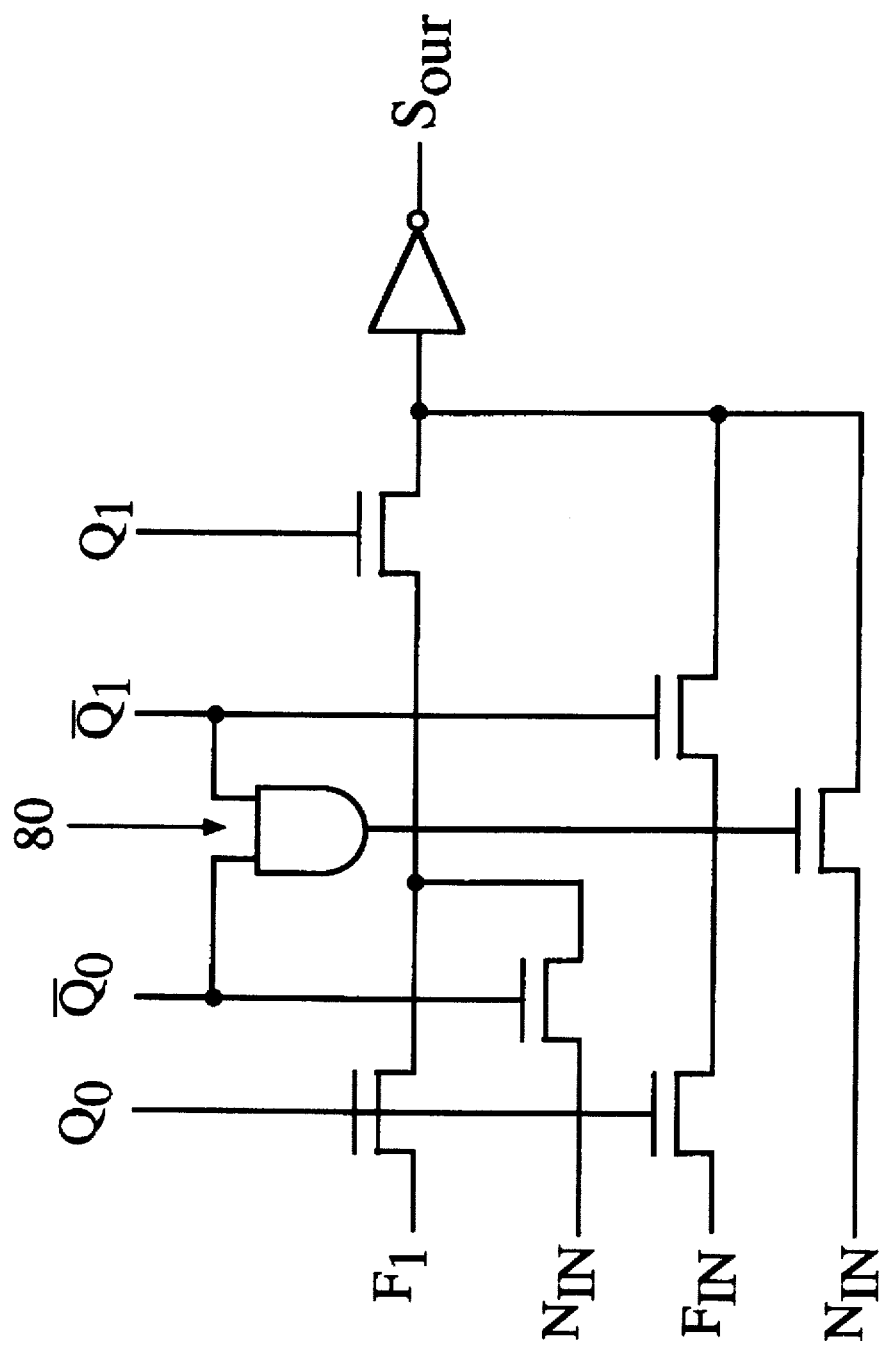
FIG. 22 is a schematic diagram of an alternative multiplexor arrangement for optimising the speed of operation of the multiplexor for particular inputs.

With regard to the multiplexors, it will be understood that the inventor may be omitted, however, with such an arrangement there is no restoration of logic levels after pass resistors and such multiplexors cannot be cascaded indefinitely. For this reason, the inventors are provided in the output of the basic pass transistor tree to provide logic level restoration to allow for the cascading of the multiplexors. In some cases it is desirable to optimise routing multiplexors for speed for particular inputs. For example, long wires in user designs normally travel in straight lines so significant performance improvements may be obtained if connections between $S_{in}$ to $N_{out}$, $E_{in}$ to $W_{out}$, $N_{in}$ to $E_{out}$ and $N_{in}$ to $S_{out}$ were faster. In certain cases, it can be advantageous to trade off additional areas of speed using circuits similar to that shown in FIG. 22. As can be seen from FIG. 22, an extra AND gate 80 has been used to allow a single pass transistor in the critical signal. More complex techniques in which critical signals are not buffered at every cell position could also be considered. It should also be understood that in this arrangement, the buffer restores the logic level because the signal which passes through several pass the transistors becomes rapidly degraded.

It will be appreciated that although the cells and components of the cells such as the multiplexors and programmable routing unit and programmable function unit are implemented using CMOS, although alternative storage technologies may be used including EPROM, EEPROM and Dynamic RAM. The multiplexor connections may be implemented directly using fusable links, antifuses or (metal) patterning of the topmost metal layer instead of using a control vector and a separate switching structure. It will be appreciated that such modifications have the same programming mode as the embodiments hereinbefore described although other programming will be required on metal patterning versions. It will also be appreciated that although the array is rectilinear it could be of any suitable shape and the orthogonal connections may be replaced by diagonal connections or a combination of orthogonal and diagonal connections. It should also be appreciated that each cell does not have to be connected to each neighbour although this is the most convenient format in a high density layout for efficient utilisation of space.

Within the aforedescribed configurable cellular array it should be understood that there are 3 possible timing disciplines which may be implemented:

self-timed; clocked including pipeline, and unsynchronised. In the case of the self-timed timing discipline, each cell generates explicit "Go" and "Done" signals which are routed in parallel with the data signals and this is advantageous because it relieves the user of most of the timing problems associated with logic design. However, it requires high cell complexity which increases design time and reduces layout efficiency where logic is required because each function is more complex, and size insofar as the individual cells are many times larger than cells with the same function because the "Go and Done signals" have to be transported about individual cells.

In the clocked timing discipline, individual cells are sychronised to a system clock which is a single global array clock, not a user clock. This has the advantage of allowing a microprocessor to read and write to internal nodes of a circuit implemented by the cells without disturbing a computation being performed by the cell array. Furthermore, in the sychronised clock system if transfers within and between cells are sychronised to a single fast system clock and an additional store is provided at each selection position then the system can be pipelined to a very low level. The additional store does not cause an unacceptable overhead because storage is available in the gate capacitance of the buffering inventors and therefore, only an additional pass transistor is required and this is best seen in FIG. 21. In the unsynchronised case as described in the body of the document the user is provided only with logic gates and takes full responsibility for timing.

I claim:

1. A configurable cellular array integrated circuit having a substrate with a length and a width, p-type and n-type diffusion zones thereon, a deposited layer of polysilicon, and first and second metal layers, wherein the polysilicon layer forms a first series of parallel strips extending across the length of the substrate in a first direction, and a second series of parallel strips extending across less than the length of the substrate in the first direction:

the second metal layer forms strips extending in a second direction orthogonal to the first direction, a first strip, being one of the strips extending in the second direction, extending across the width of the substrate:

the first metal layer forms a plurality of strips wherein at least one strip of the plurality of strips extends in the first direction and at least one other strip of the plurality of strips extends in the second direction:

the p-type and n-type zones form strips extending substantially in the first direction; and further comprising an associated RAM cell which is formed in one part of the circuit, the associated RAM cell being coupled to at least one of the first series of parallel strips to receive an access signal and being coupled to the first strip to receive a programming signal, the associated RAM cell being further coupled to one of the second series of parallel strips to provide a control signal to a switch.

2. The circuit as claimed in claim 1 wherein the p-type diffusion zone, the n-type diffusion zone, and the first metal layer are discontinuous strips.

3. The circuit as claimed in claim 1 wherein the second metal layer is a continuous strip.

4. A circuit as claimed in claim 1 wherein the circuit is fabricated using a double metal single polysilicon N-well CMOS process.

5. The circuit as claimed in claim 2 wherein the second metal layer is a continuous strip.

6. A circuit as claimed in claim 2 wherein the circuit is fabricated using a double metal single polysilicon N-well CMOS process.

7. A circuit as claimed in claim 3 wherein the circuit is fabricated using a double metal single polysilicon N-well CMOS process.

8. The circuit as claimed in claim 1 further comprising a pass transistor and associated RAM logic, the pass transistor and associated RAM logic being disposed below the first and second metal routing layers.

9. The circuit as claimed in claim 1 wherein the substrate, the p-type and n-type diffusion zones, the layer of polysilicon, and first and second metal layers form a multiplexor, and at least one strip of the second series of parallel strips is used to transfer signals from the RAM cell to the multiplexor.

* * * * *

UNITED STATES PATENT AND TRADEMARK OFFICE
CERTIFICATE OF CORRECTION

PATENT NO. : 5,491,353
DATED : February 13, 1996
INVENTOR(S) : Thomas A. Kean

Page 1 of 2

It is certified that error appears in the above-indentified patent and that said Letters Patent is hereby corrected as shown below:

Col. 1, line 17, delete "logic-elements" and insert --logic elements--.
Col. 1, line 67, delete "a forementioned" and insert --aforementioned--.
Col. 2, line 38, before "programmable" insert --RAM--.
Col. 3, line 36, delete "inventor" and insert --invertor--.
Col. 5, line 3, delete "inventors" and insert -- invertors--.
Col. 6, line 48, delete "inventors" and insert --invertors--.
Col. 6, line 67, delete "inversion" and insert --inversions--.
Col. 7, line 59, delete "inventor" and insert --invertor--.
Col. 7, lines 62-63, delete "inventors" and insert --invertors--.
Col. 8, line 12, delete "Nell" and insert -- Neil--.
Col. 8, line 42, delete "22" and insert --2--.
Col. 8, line 42, delete "inventor" and insert --invertor--.
Col. 9, line 10, delete "(chip.2)" and insert --(chip 2)--.
Col. 9, line 21, delete "inventor" and insert --invertor--.
Col. 9, line 35, delete "which-is" and insert --which is--.
Col. 9, line 63, delete "Fla." and insert --FIG.--.
Col. 10, line 30, delete "Desjan" and insert --Design--.
Col. 11, line 5, delete "logic-rather" and insert --logic rather--.
Col. 11, line 43, before "cells" insert --of--.
Col. 11, line 60, delete "inventor" and insert --invertor--.
Col. 11, line 63, delete "inventors" and insert --invertors--.
Col. 12, line 16, after "CMOS" insert --technology--.
Col. 12, line 59, delete "inventors" and insert --invertors--.

UNITED STATES PATENT AND TRADEMARK OFFICE
CERTIFICATE OF CORRECTION

PATENT NO. : 5,491,353
DATED : February 13, 1996
INVENTOR(S) : Thomas A. Kean

It is certified that error appears in the above-indentified patent and that said Letters Patent is hereby corrected as shown below:

Col. 13, line 10, delete "substrate:" and insert --substrate;--.

Signed and Sealed this

Ninth Day of September, 1997

Attest:

BRUCE LEHMAN

Attesting Officer

Commissioner of Patents and Trademarks